United States Patent
Hung et al.

(10) Patent No.: US 8,981,487 B2
(45) Date of Patent: Mar. 17, 2015

(54) FIN-SHAPED FIELD-EFFECT TRANSISTOR (FINFET)

(71) Applicant: United Microelectronics Corp., Hsin-Chu (TW)

(72) Inventors: Yu-Hsiang Hung, Tainan (TW); Ssu-I Fu, Kaohsiung (TW); Chien-Ting Lin, Hsinchu (TW); Po-Chao Tsao, New Taipei (TW); Chung-Fu Chang, Tainan (TW); Cheng-Guo Chen, Changhua County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/954,991

(22) Filed: Jul. 31, 2013

(65) Prior Publication Data

US 2015/0035069 A1    Feb. 5, 2015

(51) Int. Cl.
| | | |
|---|---|---|
| H01L 29/76 | (2006.01) | |
| H01L 29/94 | (2006.01) | |
| H01L 31/062 | (2012.01) | |
| H01L 31/113 | (2006.01) | |
| H01L 27/092 | (2006.01) | |
| H01L 21/8238 | (2006.01) | |

(52) U.S. Cl.
CPC .... *H01L 27/0924* (2013.01); *H01L 21/823821* (2013.01)
USPC .............................. 257/369; 257/327; 438/478

(58) Field of Classification Search
USPC .................... 257/327, 369; 438/222, 294.478
See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,043,138 A | 3/2000 | Ibok |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |

(Continued)

*Primary Examiner* — Phuc Dang

(74) *Attorney, Agent, or Firm* — Winston Hsu; Scott Margo

(57) ABSTRACT

A method for fabricating fin-shaped field-effect transistor (FinFET) is disclosed. The method includes the steps of: providing a substrate; forming a fin-shaped structure in the substrate; forming a shallow trench isolation (STI) on the substrate and around the bottom portion of the fin-shaped structure; forming a first gate structure on the STI and the fin-shaped structure; and removing a portion of the STI for exposing the sidewalls of the STI underneath the first gate structure.

8 Claims, 5 Drawing Sheets

(56) References Cited

U.S. PATENT DOCUMENTS

| | | |
|---|---|---|
| 6,365,476 B1 | 4/2002 | Talwar |
| 6,368,926 B1 | 4/2002 | Wu |
| 6,444,591 B1 | 9/2002 | Schuegraf |
| 6,492,216 B1 | 12/2002 | Yeo |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,921,963 B2 | 7/2005 | Krivokapic |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,087,477 B2 | 8/2006 | Fried |
| 7,091,551 B1 | 8/2006 | Anderson |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,247,887 B2 | 7/2007 | King |
| 7,250,658 B2 | 7/2007 | Doris |
| 7,288,822 B1 | 10/2007 | Ting |
| 7,303,999 B1 | 12/2007 | Sriraman |
| 7,309,626 B2 | 12/2007 | Ieong |
| 7,335,959 B2 | 2/2008 | Curello |
| 7,352,034 B2 | 4/2008 | Booth, Jr. |
| 7,410,859 B1 | 8/2008 | Peidous |
| 7,462,239 B2 | 12/2008 | Brabant |
| 7,470,570 B2 | 12/2008 | Beintner |
| 7,491,615 B2 | 2/2009 | Wu |
| 7,494,856 B2 | 2/2009 | Zhang |
| 7,494,858 B2 | 2/2009 | Bohr |
| 7,531,437 B2 | 5/2009 | Brask |
| 7,550,336 B2 | 6/2009 | Hsiao |
| 7,569,857 B2 | 8/2009 | Simon |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 8,765,546 B1 * | 7/2014 | Hung et al. ............ 438/222 |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0195624 A1 | 10/2004 | Liu |
| 2004/0227164 A1 | 11/2004 | Lee |
| 2005/0051825 A1 | 3/2005 | Fujiwara |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0099830 A1 | 5/2006 | Walther |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0286729 A1 | 12/2006 | Kavalieros |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0108528 A1 | 5/2007 | Anderson |
| 2007/0128783 A1 | 6/2007 | Ting |
| 2007/0158756 A1 | 7/2007 | Dreeskornfeld |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0157208 A1 | 7/2008 | Fischer |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0124097 A1 | 5/2009 | Cheng |
| 2009/0166625 A1 | 7/2009 | Ting |
| 2009/0184402 A1 | 7/2009 | Chen |
| 2009/0186475 A1 | 7/2009 | Ting |
| 2009/0242964 A1 | 10/2009 | Akil |
| 2009/0246922 A1 | 10/2009 | Wu |
| 2009/0269916 A1 | 10/2009 | Kang |
| 2009/0278170 A1 | 11/2009 | Yang |
| 2009/0302348 A1 | 12/2009 | Adam |
| 2010/0001317 A1 | 1/2010 | Chen |
| 2010/0038679 A1 | 2/2010 | Chan et al. |
| 2010/0048027 A1 | 2/2010 | Cheng |
| 2010/0072553 A1 | 3/2010 | Xu |
| 2010/0093147 A1 | 4/2010 | Liao |
| 2010/0144121 A1 | 6/2010 | Chang |
| 2010/0167506 A1 | 7/2010 | Lin |
| 2011/0210393 A1 | 9/2011 | Chen et al. |
| 2012/0001266 A1* | 1/2012 | Lim et al. ............ 257/369 |
| 2014/0065782 A1* | 3/2014 | Lu et al. ............ 438/294 |

* cited by examiner

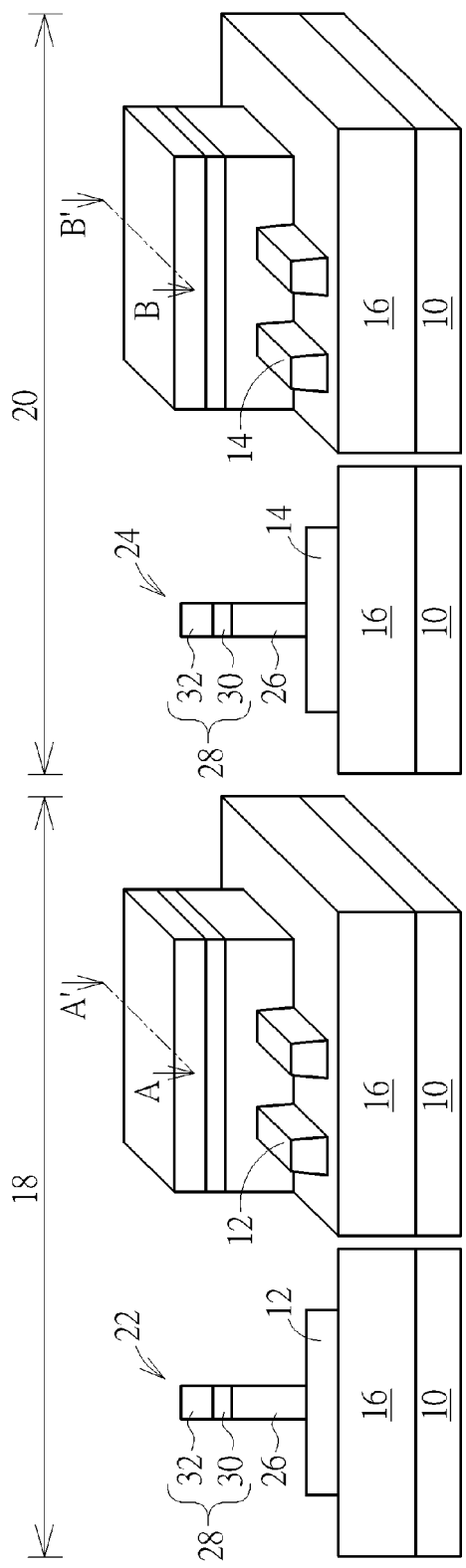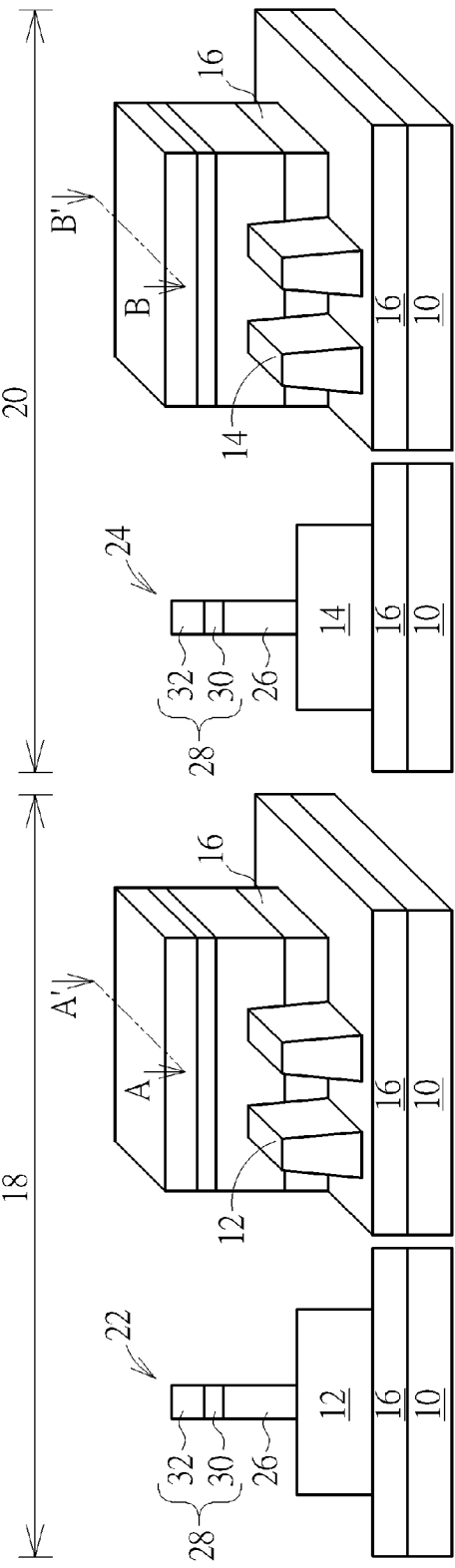

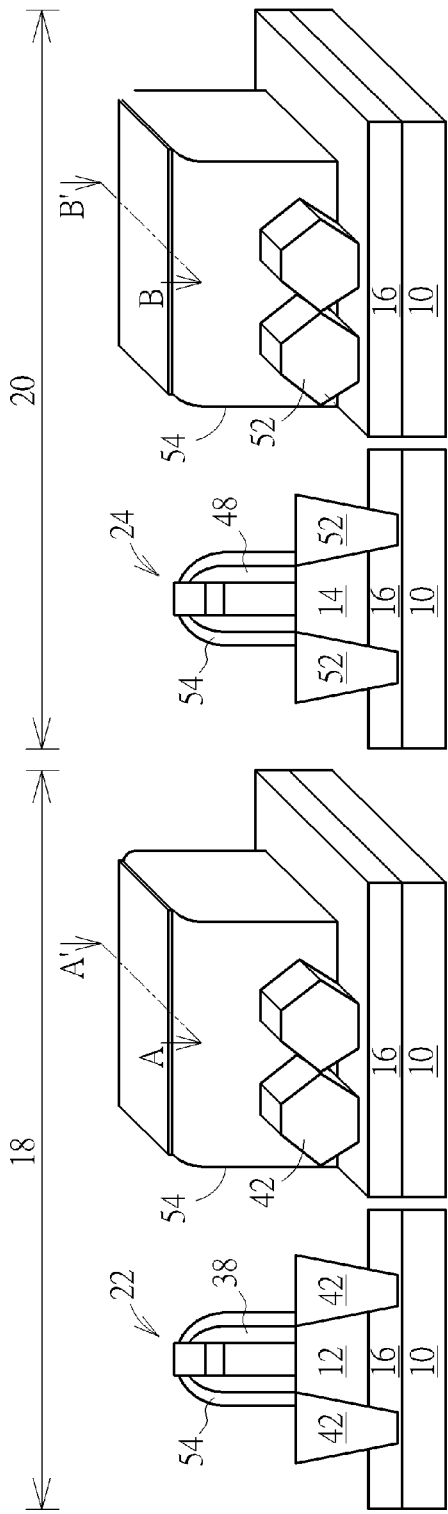
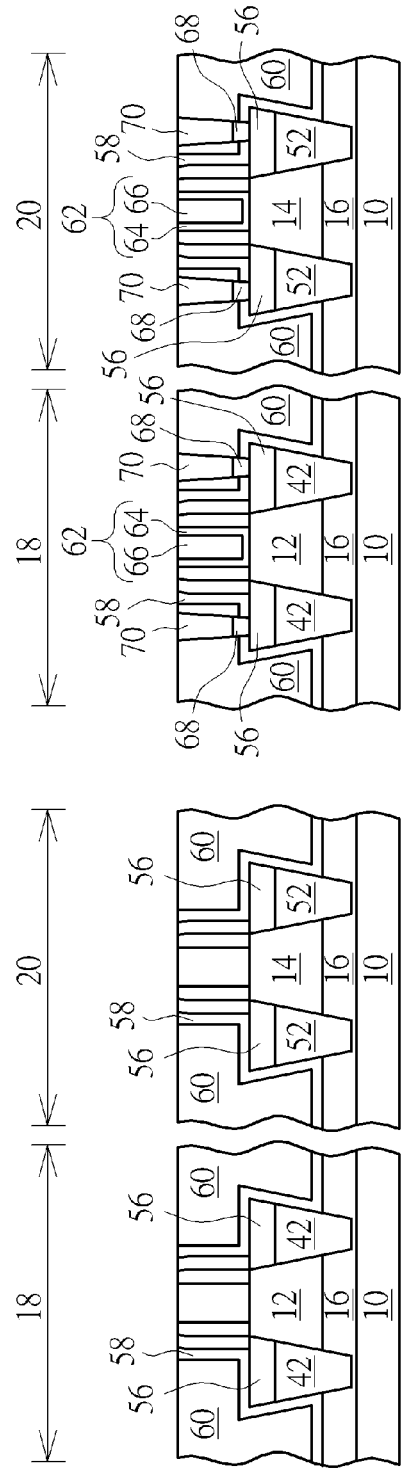
FIG. 9
FIG. 10
FIG. 11

FIN-SHAPED FIELD-EFFECT TRANSISTOR (FINFET)

BACKGROUND OF THE INVENTION

1. Field of the Invention

The invention relates to a method for fabricating fin-shaped field effect transistor (FinFET), and more particularly, to a method of removing a portion of the shallow trench isolation (STI) to expose the sidewalls of the STI underneath the gate structures after the gate structures are formed.

2. Description of the Prior Art

In recent years, as various kinds of consumer electronic products have continuously improved and been miniaturized, the size of semiconductor components has reduced accordingly, in order to meet requirements of high integration, high performance, and low power consumption.

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, current process for fabricating FinFETs is still insufficient in producing products with satisfactory performance. Hence, how to improve the current process flow for producing FinFETs with enhanced performance has become an important task in this field.

SUMMARY OF THE INVENTION

It is therefore an objective of the present invention to provide a method for fabricating FinFET and structure thereof for improving the performance of the device fabricated by using conventional method.

According to a preferred embodiment of the present invention, a method for fabricating fin-shaped field-effect transistor (FinFET) is disclosed. The method includes the steps of: providing a substrate; forming a fin-shaped structure in the substrate; forming a shallow trench isolation (STI) on the substrate and around the bottom portion of the fin-shaped structure; forming a first gate structure on the STI and the fin-shaped structure; and removing a portion of the STI for exposing the sidewalls of the STI underneath the first gate structure.

According to another aspect of the present invention, a fin-shaped field-effect transistor (FinFET) is disclosed. The FinFET includes: a substrate; a fin-shaped structure on the substrate; a shallow trench isolation (STI) on the substrate and around the fin-shaped structure; and a gate structure on the STI and the fin-shaped structure, wherein the STI under the gate structure and the STI around the gate structure has a step height.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-11 illustrate a method for fabricating a FinFET according to a preferred embodiment of the present invention

DETAILED DESCRIPTION

Figure 3:
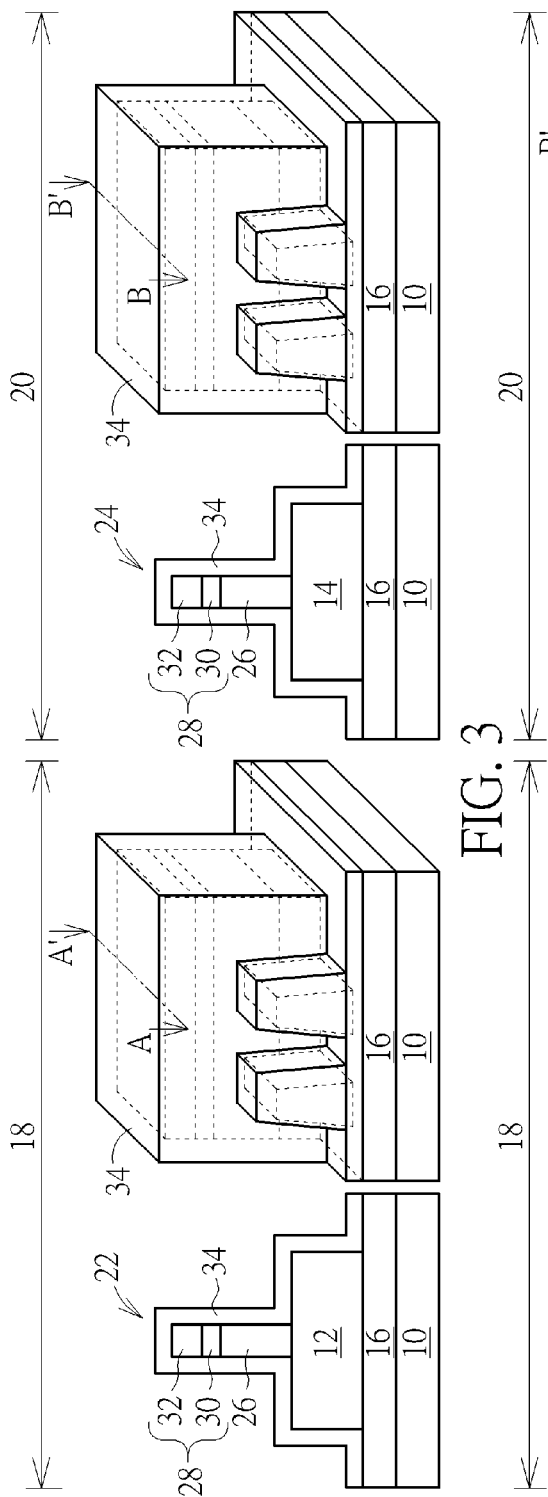

Referring to FIGS. 1-11, FIGS. 1-11 illustrate a method for fabricating a semiconductor device, such as a FinFET according to a preferred embodiment of the present invention, in which the structures shown in the left side of each figure depicts a horizontal view of the three-dimensional structures shown on the right side of each figure along the sectional lines AA' and BB'. As shown in FIG. 1, a substrate 10, such as a silicon substrate or a silicon-on-insulator (SOI) substrate is provided. A first transistor region, such as a PMOS region 18 and a second transistor region, such as a NMOS region 20 are defined on the substrate 10.

At least a first fin-shaped structure 12, at least a second fin-shaped structure 14, and an insulating layer are formed on the substrate 10. The bottom of the fin-shaped structures 12, 14 are preferably surrounded by the insulating layer to form a shallow trench isolation (STI) 16, in which the STI 16 is preferably composed of silicon oxide. A plurality of first gate structures 22 and second gate structures 24 are formed on part of the first fin-shaped structures 12 and the second fin-shaped structures 14 respectively. Each of the first gate structures 22 and the second gate structures 24 includes a gate electrode 26 and a hard mask 28 disposed on the gate electrode 26, in which the hard mask 28 in this embodiment is preferably a composite layer consisted of a silicon nitride hard mask 30 and a oxide hard mask 32. It should be noted that even though two hard mask layers 30 and 32 are formed in this embodiment to serve as the hard mask 28, the quantity and material of the hard mask could be adjusted according to the demand of the product. For instance, the hard mask 28 could be a single mask layer composed of silicon nitride, silicon oxide, or other materials, or a composite layer made of material selected from a group consisting of silicon nitride, silicon oxide, and other materials, which are all within the scope of the present invention.

The formation of the first fin-shaped structures 12 and the second fin-shaped structures 14 could be fabricated through the following processes. For instance, a patterned mask (now shown) is first formed on the substrate, 10, and an etching process is performed to transfer the pattern of the patterned mask to the substrate 10. Next, depending on the structural difference of a tri-gate transistor or dual-gate fin-shaped transistor being fabricated, the patterned mask could be stripped or retained, and processes including deposition, chemical mechanical polishing (CMP), and etching back are carried out to form an insulating layer 16 surrounding the bottom of the fin-shaped structures 12, 14. Alternatively, the formation of the first fin-shaped structures 12 and the second fin-shaped structures 14 could also be accomplished by first forming a patterned hard mask (not shown) on the substrate 10, and then performing an epitaxial process on the exposed substrate 10 through the patterned hard mask to grow a semiconductor layer. This semiconductor layer could then be used as the corresponding fin-shaped structures 12, 14 directly, and in a similar fashion, the patterned hard mask could be removed or retained, and deposition, CMP, and then etching back could be used to form a STI 16 to surround the bottom of the fin-shaped structures 12, 14.

According to a preferred embodiment of the present invention, the height of the first fin-shaped structures 12 and the second fin-shaped structures 14 exposed from the surface of the STI 16 is approximately 250 Angstroms. However, it should be noted that even though the first fin-shaped structures 12 and the second fin-shaped structures 14 appeared have equivalent height as disclosed in this embodiment, the height of the fin-shaped structures 12 and 14 could also be different according to the demand of the product. In addition, even though only four fin-shaped structures 12 and 14 are depicted in this embodiment, the quantity of the fin-shaped structures is not limited to the one disclosed herein, but could be adjusted according to the demand of the product.

After the first fin-shaped structures 12 and the second fin-shaped structures 14 are formed, a dielectric layer (not shown), a gate electrode layer (not shown), and a hard mask (not shown) are sequentially deposited on the first fin-shaped structures 12 and the second fin-shaped structures 14, and a pattern transfer is carried out to pattern the three layers for forming the first gate structures 22 and the second gate structures 24, in which each of the first gate structures 22 and the second gate structures 24 includes a gate electrode 26, a gate dielectric layer (not shown) between the fin-shaped structures 12 and 14 and the gate electrodes 26, and a hard mask 28 situated on top of the gate electrodes 26. The gate electrodes 26 are preferably consisted of doped or non-doped silicon, but could also be selected from a material consisting silicide of metals. The gate dielectric layer is preferably consisting of a silicon layer, such as SiO, SiN, or SiON, but could also be selected from dielectric materials having high-k dielectric properties.

Next, as shown in FIG. 2, an etching process is carried out to remove a portion of the STI 16 around the gate structures 22 and 24 for exposing the STI 16 underneath the first gate structures 22 and the second gate structures 24. According to a preferred embodiment of the present invention, the height of the STI 16 being removed through the etching process is preferably between 90-170 Angstroms, and most preferably at around 100 Angstroms.

Next, as shown in FIG. 3, a first hard mask 34 is formed entirely to cover the first gate structures 22 and the second gate structures 24, and also the exposed STI 16 underneath the first gate structures 22 and the second gate structures 24. According to a preferred embodiment of the present invention, the first hard mask 34 is selected from a group consisting of SiC, SiON, SiN, SiCN, and SiBN, but not limited thereto.

Figure 4:
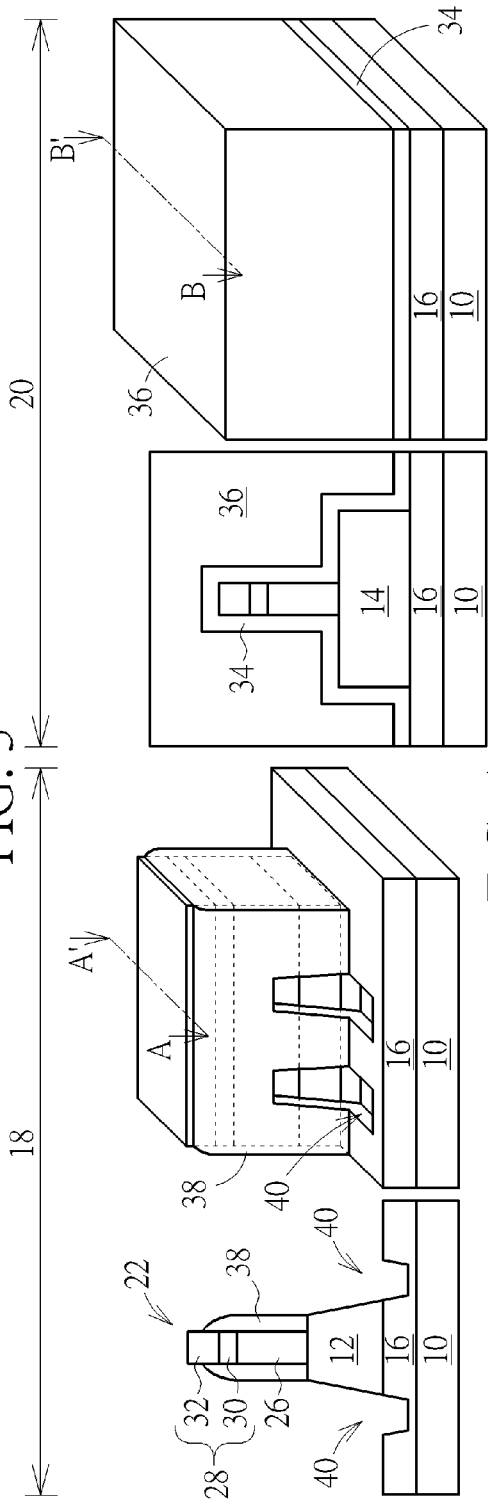

As shown in FIG. 4, a patterned resist 36 is formed in the NMOS region 20, and a portion of the first hard mask 34 in the PMOS region 18 is removed by using the patterned resist 36 as mask to form a first spacer 38 around each first gate structure 22 and a first recess 40 in each first fin-shaped structure 12 adjacent to the first gate structure 22.

Figure 5:
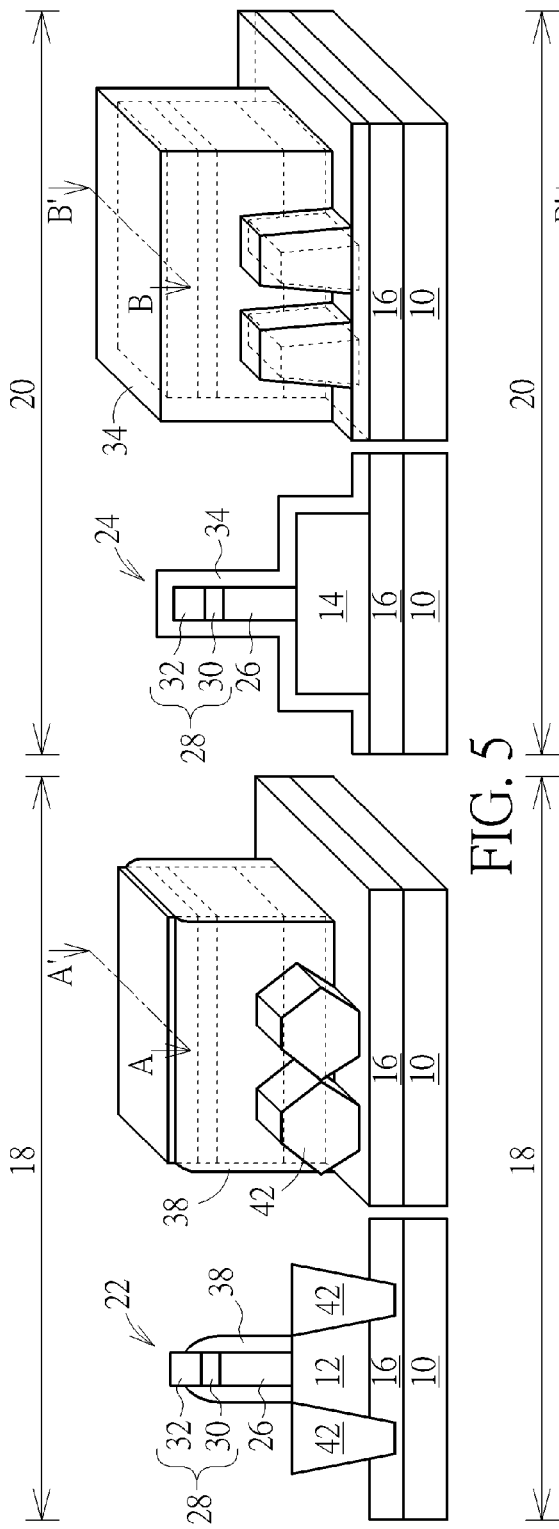

As shown in FIG. 5, after stripping the patterned resist 36 from the NMOS region 20, a selective epitaxial growth is conducted to form a first epitaxial layer 42 composed of silicon germanium in the first recess 40. According to an embodiment of the present invention, in-situ dopant concentration during the epitaxial growth of the first epitaxial layer may be different to create a gradient in the first recess 40.

Figure 6:
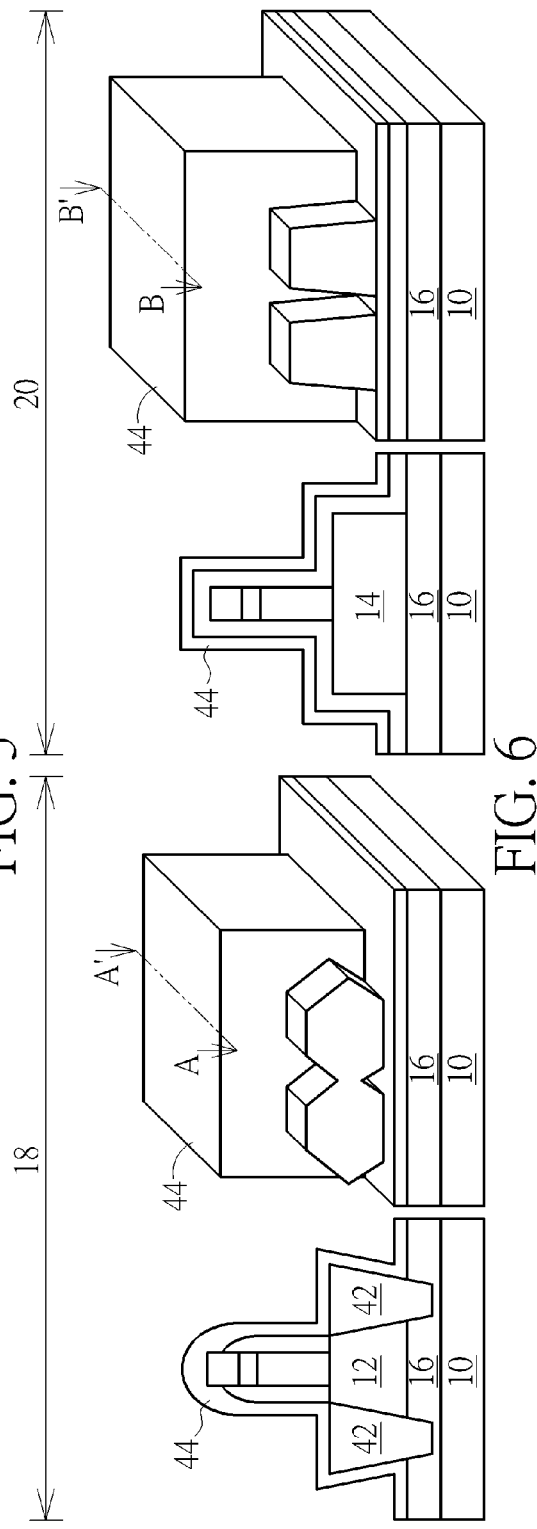

Next, as shown in FIG. 6, a second hard mask 44 is formed to entirely cover the first gate structures 22 and the second gate structures 24, and part of the first hard mask 34 of the NMOS region 20. According to a preferred embodiment of the present invention, the second hard mask 44 is selected from a group consisting of SiC, SiON, SiN, SiCN, and SiBN, but not limited thereto.

Figure 7:
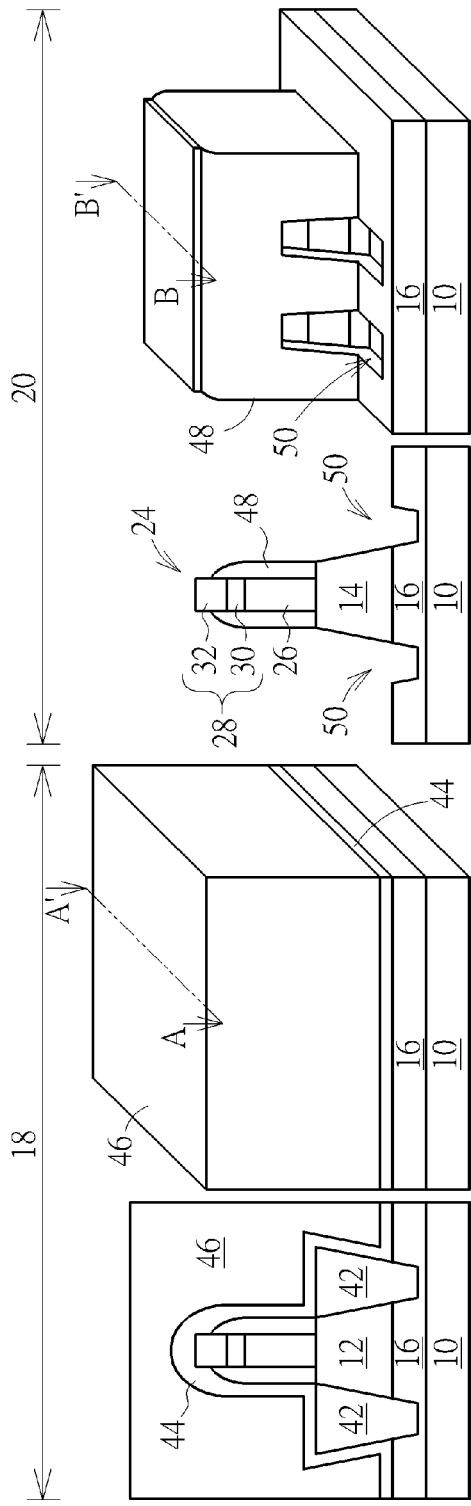

As shown in FIG. 7, a patterned resist 46 is formed in the PMOS region 18, and part of or all of the second hard mask 44 in the NMOS region 20 is removed by using the patterned resist 46 as mask to form another first spacer 48 around each second gate structure 24 and a second recess 50 in each second fin-shaped structure 14 adjacent to the second gate structure 24.

Figure 8:
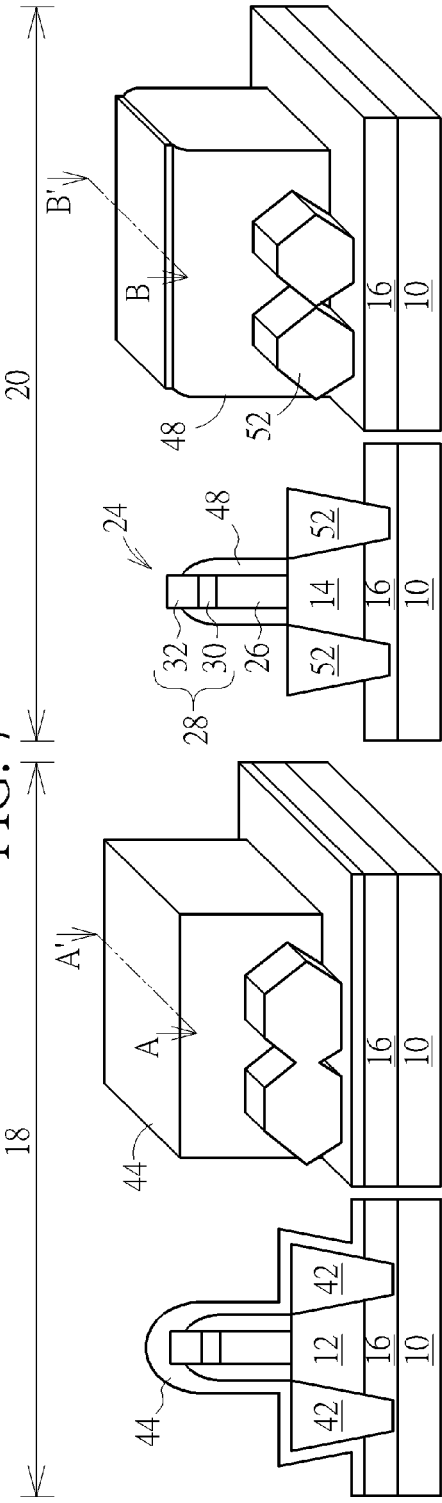

Next, as shown in FIG. 8, after stripping the patterned resist 46 from the PMOS region 18, a selective epitaxial growth is conducted to form a second epitaxial layer 52 composed of silicon phosphorus (SiP) in the second recess 50. It should be noted that even though a first epitaxial layer 42 and a second epitaxial layer 52 along with recesses are formed in the PMOS region 18 and the NMOS region 20 in this embodiment, the presence of the recess and epitaxial layers 42 and 52 is not limited to the design disclosed herein. For instance, the present invention could also include variations such as PMOS region 18 having recess and epitaxial layer while NMOS region 20 having no recess and epitaxial layer; or PMOS region 18 having recess and epitaxial layer while NMOS region having no recess and no epitaxial layer, which are all within the scope of the present invention.

Next, as shown in FIG. 9, after stripping the second hard mask 44 from the PMOS region 18, a second spacer 54 is formed around each first gate structure 22 and the second gate structure 24. The steps for forming the second spacer 54 could be accomplished in a similar manner to the aforementioned process for forming the first spacers 38, 48 and the details of which are omitted herein for the sake of brevity. However, it should be noted that even though the second spacers 54 are formed directly on the sidewall of the first spacers 38, 48 as revealed in this embodiment, the first spacers 38, 48 could also be removed before the formation of the second spacers 54.

For instance, after the first epitaxial layer 42 is formed, instead of forming the second hard mask 44 directly, the first hard mask 34 is stripping from both the PMOS region 18 and the NMOS region 20 and then the second hard mask 44 is formed to cover the first gate structures 22 and the second gate structures 24. Next, the first spacers 48 and the recess 50 are formed in the NMOS region 20, and after forming the second epitaxial layer 52 in the NMOS region 20, the second hard mask 44 is then stripped from both the PMOS region 18 and the NMOS region 20. Hence, according to this approach of the present invention, after the sidewalls of both the first gate structures 22 and the second gate structures 24 are exposed, the second spacers 54 are formed directly on the sidewalls of the first gate structures 22 and the second gate structures 24.

Next, referring to FIGS. 10-11, which depict the steps of forming metal gates in each of the PMOS region and the NMOS region after the formation of the second spacer. For simplicity reason, three-dimensional structures are omitted and only two-dimensional structures are shown in the figures.

As shown in FIG. 10, a source/drain region 56 is formed in each of the PMOS region 18 and the NMOS region 20, and then a contact etch stop layer (CESL) 58 is deposited on the first gate structures 22, second gate structures 24, and second spacers 54 of the PMOS region 18 and the NMOS region 20. Next, a flowable chemical vapor deposition, FCVD) is carried out to form an interlayer dielectric (ILD) layer 60 on the CESL 58. A planarizing process, such as a chemical mechanical polishing (CMP) process is performed to partially remove the ILD layer 60, CESL 58, and hard mask 28 so that the top of the gate electrodes 26 composed of silicon within the first gate structures 22 and the second gate structures 24 are exposed and substantially even with the surface of the ILD layer 60.

Next, as shown in FIG. 11, a replacement metal gate (RMG) process is conducted to form a metal gate 62 in each of the PMOS region 18 and the NMOS region 20, in which each metal gate 62 includes a high-k dielectric layer 64 and a work function metal layer 66.

According to a preferred embodiment of the present invention, the RMG process could be carried out by first performing a selective dry etching or wet etching process, such as using etchants including ammonium hydroxide ($NH_4OH$) or tetramethylammonium hydroxide (TMAH) to remove the silicon layer from the first gate structures 22 and the second gate structures 24 without etching the ILD layer 60 for forming a recess (not shown) in each transistor region 18 and 20. Next, a high-k dielectric layer 64 and an adequate work function metal layer 66 are deposited into the recess, and the layers 64 and 66 are planarized to form a metal gate 62 in each PMOS region 18 and NMOS region 20.

According to a preferred embodiment of the present invention, RMG process includes approaches such as gate first process, high-k first process from gate last process, high-k last process from gate last process, or silicon gate process. The present embodiment is preferably accomplished by employing the high-k last process from the gate last process, hence the high-k dielectric layer 64 preferably has a "U-shaped" cross section. The high-k dielectric layer 64 could be made of dielectric materials having a dielectric constant (k value) larger than 4, in which the material of the high-k dielectric layer 64 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The high-k dielectric layer 64 can be formed through an atomic layer deposition (ALD) process or a metal-organic chemical vapor deposition (MOCVD) process, but is not limited thereto. Furthermore, a dielectric layer (not shown) such as a silicon oxide layer can be selectively formed between the substrate 10 and the high-k dielectric layer 60. The metal gate 62 could contain one or a plurality of metal layer such as a work function metal layer 66, a barrier layer (not shown) and a low-resistance metal layer (not shown). The work function metal layer 66 is formed for tuning the work function of the later formed metal gates 62 to be appropriate in an NMOS or a PMOS. For an NMOS transistor, the work function metal layer 66 having a work function ranging between 3.9 eV and 4.3 eV may include titanium aluminide (TiAl), zirconium aluminide (ZrAl), tungsten aluminide (WAl), tantalum aluminide (TaAl), or hafnium aluminide (HfAl), but it is not limited thereto. For a PMOS transistor, the work function metal layer 66 having a work function ranging between 4.8 eV and 5.2 eV may include titanium nitride (TiN), tantalum nitride (TaN), tantalum carbide (TaC), but it is not limited thereto. The material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

After the RMG process is completed, a plurality of contact holes (not shown) could be formed in the ILD layer 60 to expose the first epitaxial layer 42 and the second epitaxial layer 52, and a salicide process could be performed, such as by first depositing a metal layer (not shown) consisting of cobalt (Co), titanium (Ti), and/or nickel (Ni) into the contact holes, and a rapid thermal anneal (RTA) process is conducted for forming a silicide layer 68.

Next, contact plugs 70 are further formed in the contact holes. The steps of forming the contact plugs 70 are described below. First, a barrier/adhesive layer (not shown), a seed layer (not shown) and a conductive layer (not shown) are sequentially formed to cover the ILD layer 60 and fill the contact holes, in which the barrier/adhesive layer are formed conformally along the surfaces of the contact holes, and the conductive layer is filled completely into the contact holes. The barrier/adhesive layer could be used for preventing metal elements of the conductive layer from diffusing into the neighboring ILD layer 60, and also increase the adhesiveness between the conductive layer and the ILD layer 60. The barrier/adhesive layer may be consisted of tantalum (Ta), titanium (Ti), titanium nitride (TiN) or tantalum nitride (TaN) or a suitable combination of metal layers such as Ti/TiO, but is not limited thereto. A material of the seed layer is preferably the same as a material of the conductive layer, and a material of the conductive layer may include a variety of low-resistance metal materials, such as aluminum (Al), titanium (Ti), tantalum (Ta), tungsten (W), niobium (Nb), molybdenum (Mo), copper (Cu) or the likes, preferably tungsten or copper, and more preferably tungsten, which can form suitable Ohmic contact between the conductive layer and the metal silicide layer 68 or between the conductive layer and the source/drain regions 56 underneath. Then, a planarization step, such as a chemical mechanical polish (CMP) process or an etching back process or combination thereof, can be performed to remove the barrier/adhesive layer, the seed layer and the conductive layer outside the contact holes, so that a top surface of a remaining conductive layer and the top surface of the ILD layer 60 are coplanar, thereby forming a plurality of contact plugs 70 and completing the fabrication of a FinFET according to a preferred embodiment of the present invention.

By utilizing aforementioned flow for fabricating FinFET, a FinFET structure is also disclosed according to an embodiment of the present invention. For instance, as revealed by the structures in the PMOS region 18 from the three-dimensional view in FIG. 2 and two-dimensional view in FIG. 14, a FinFET structure preferably includes a substrate 10, a fin-shaped structure 12 in the substrate 10, a STI 16 on the substrate and around the fin-shaped structure 12, and a gate structure 62 on the STI 16 and the fin-shaped structure 12, in which the STI 16 under the gate structure 62 and the STI 16 around the gate structure 62 has a step height. Preferably, the gate structure 62 is a metal gate including at least a high-k dielectric layer 64 on the substrate 10 and a work function metal gate 66 on the high-k dielectric layer 64. An epitaxial layer 42 is also formed in the fin-shaped structure 12 adjacent to two sides of the gate structure 62, in which the epitaxial layer 42 in the case for PMOS, is composed of silicon germanium.

Overall, by reducing the height of the STI, or by removing part of the STI to expose a portion of the STI underneath the silicon gate structure before carrying out the dual epitaxial growth process for forming epitaxial layers in the substrate, the present invention could effectively enlarge the size of the epitaxial layer grown in the recess and while improving the overall shape of the epitaxial layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fin-shaped field-effect transistor (FinFET), comprising:
   a substrate;
   a fin-shaped structure on the substrate;
   a shallow trench isolation (STI) on the substrate and around the fin-shaped structure; and
   a first gate structure on the STI and the fin-shaped structure, wherein the STI under the first gate structure and the STI around the first gate structure has a step height.

2. The FinFET of claim 1, further comprising
   the first gate structure on a first transistor region of the substrate and a second gate structure on a second transistor region of the substrate.

3. The FinFET of claim 2, wherein each of the first gate structure and the second gate structure comprises:
   a high-k dielectric layer on the substrate; and
   a metal gate on the high-k dielectric layer.

4. The FinFET of claim 2, wherein the first transistor region is a PMOS region and the second transistor region is a NMOS region.

5. The FinFET of claim 4, wherein the PMOS region comprises a recess and an epitaxial layer and the NMOS region comprises no recess and an epitaxial layer.

6. The FinFET of claim 4, wherein the PMOS region comprises a recess and an epitaxial layer and the NMOS region comprises no recess and no epitaxial layer.

7. The FinFET of claim 4, wherein the PMOS region comprises a recess and an epitaxial layer and the NMOS region comprises a recess and an epitaxial layer.

8. The FinFET of claim 7, wherein the epitaxial layer of the PMOS region comprises silicon germanium and the epitaxial layer of the NMOS region comprises silicon phosphorus.

\* \* \* \* \*